(12) United States Patent
Itaka

(10) Patent No.: US 7,409,655 B2
(45) Date of Patent: Aug. 5, 2008

(54) METHOD OF DESIGNING SEMICONDUCTOR INTEGRATED CIRCUIT AND APPARATUS FOR DESIGNING THE SAME

(75) Inventor: Yasuhito Itaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 311 days.

(21) Appl. No.: 11/316,744

(22) Filed: Dec. 27, 2005

(65) Prior Publication Data

US 2006/0225013 A1 Oct. 5, 2006

(30) Foreign Application Priority Data

Mar. 31, 2005 (JP) ............... 2005-103296

(51) Int. Cl.
*G06F 17/50* (2006.01)
(52) U.S. Cl. .............. 716/4; 716/2; 716/5; 716/6
(58) Field of Classification Search ......... 716/2, 716/4–6
See application file for complete search history.

(56) References Cited

U.S. PATENT DOCUMENTS

| | | | | |
|---|---|---|---|---|
| 5,245,543 A | * | 9/1993 | Smayling et al. ............ | 703/13 |
| 5,923,569 A | * | 7/1999 | Kumashiro et al. ........... | 716/7 |
| 6,308,312 B1 | * | 10/2001 | Houston ...................... | 716/17 |
| 6,426,908 B1 | * | 7/2002 | Hidaka ........................ | 365/222 |
| 6,842,714 B1 | * | 1/2005 | Acar et al. ................... | 702/136 |
| 7,107,566 B1 | * | 9/2006 | McElheny .................... | 716/16 |
| 2002/0122329 A1 | * | 9/2002 | Ma et al. ..................... | 365/154 |
| 2005/0198594 A1 | | 9/2005 | Itaka | |

OTHER PUBLICATIONS

Koji Nii, et al., "A 90nm Low Power 32K-Byte Embedded SRAM with Gate Leakage Suppression Circuit for Mobile Applications", 2003 Symposium on VLSI Circuits, Digest of Technical Papers, 2003, pp. 247-250.

* cited by examiner

*Primary Examiner*—Vuthe Siek
*Assistant Examiner*—Naum B Levin
(74) *Attorney, Agent, or Firm*—Oblon, Spivak, McClelland, Maier & Neustadt, P.C.

(57) ABSTRACT

A method of designing a semiconductor integrated circuit having a plurality of transistors calculates a leak current corresponding to a sum of a gate leak and a channel leak at each node in the semiconductor integrated circuit, estimates a voltage drop value due to the calculated leak current, determines whether or not the voltage drop value exceeds a threshold value for each node, and inserts a buffer to a node determined that the voltage drop value exceeds the threshold value.

6 Claims, 5 Drawing Sheets

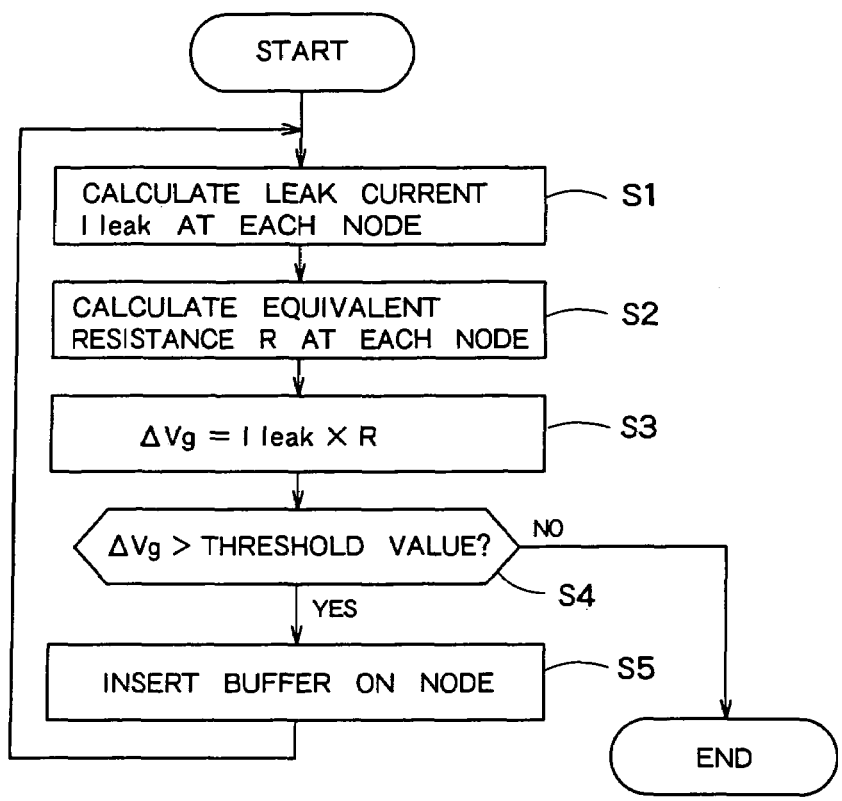
F I G. 1
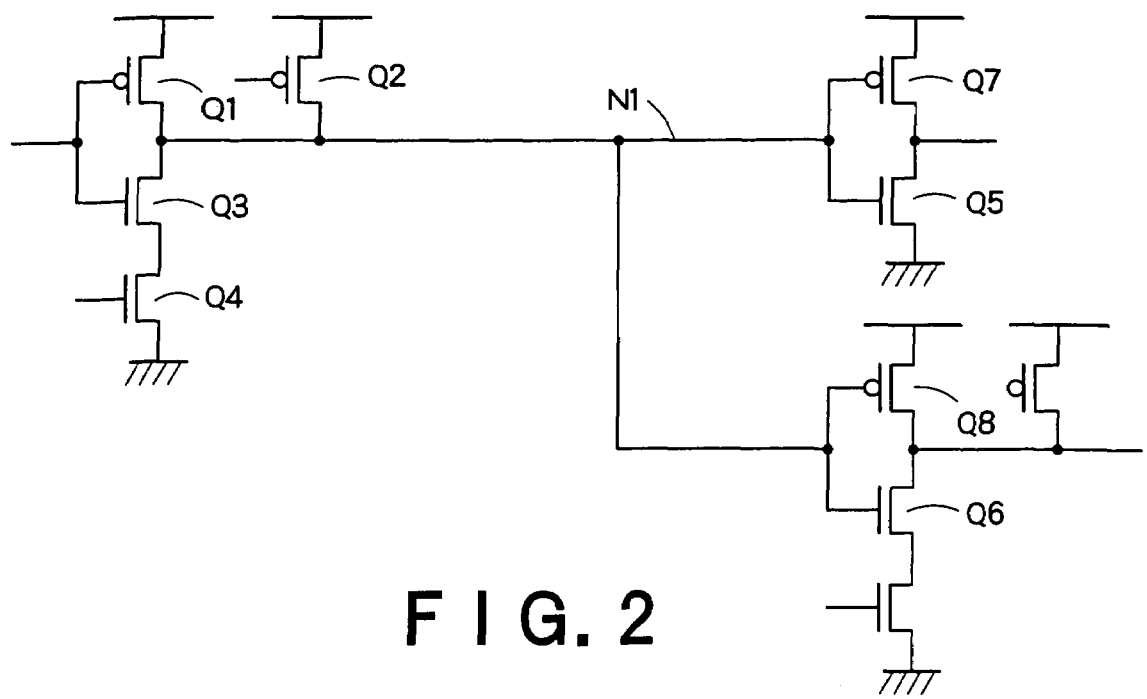
F I G. 2

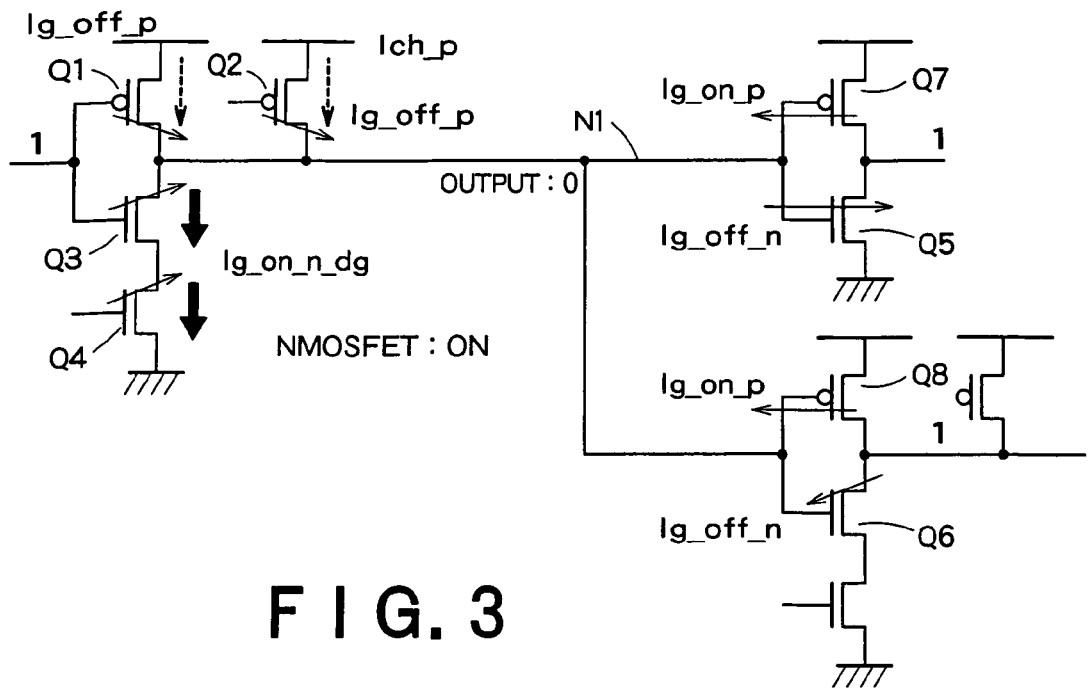
F I G. 3
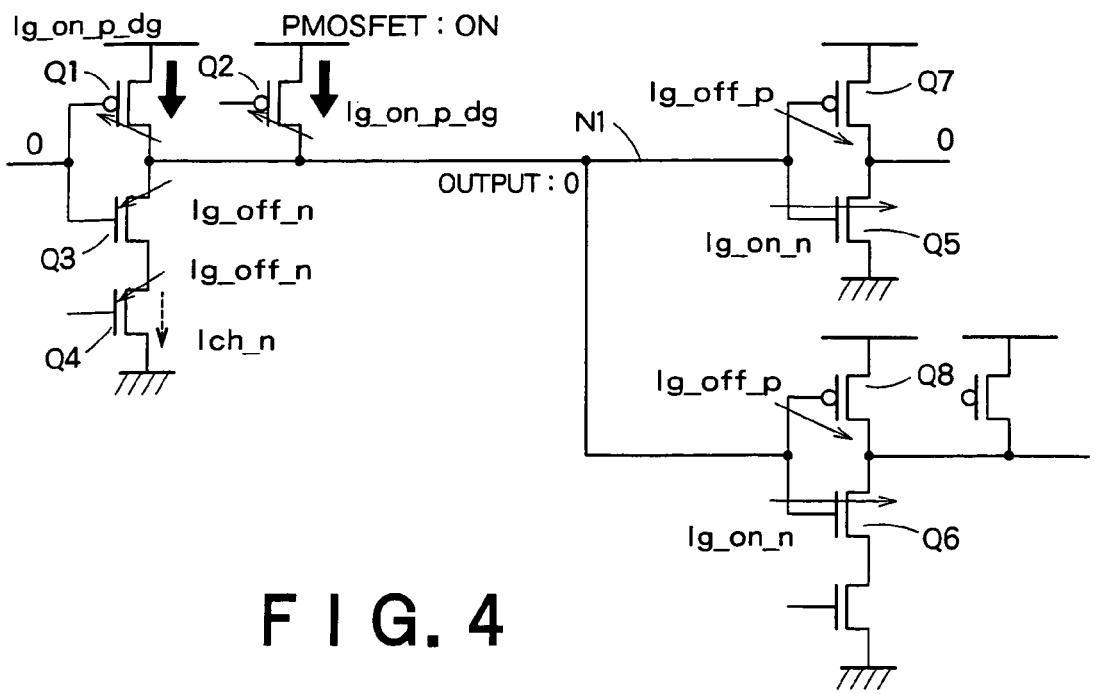
F I G. 4

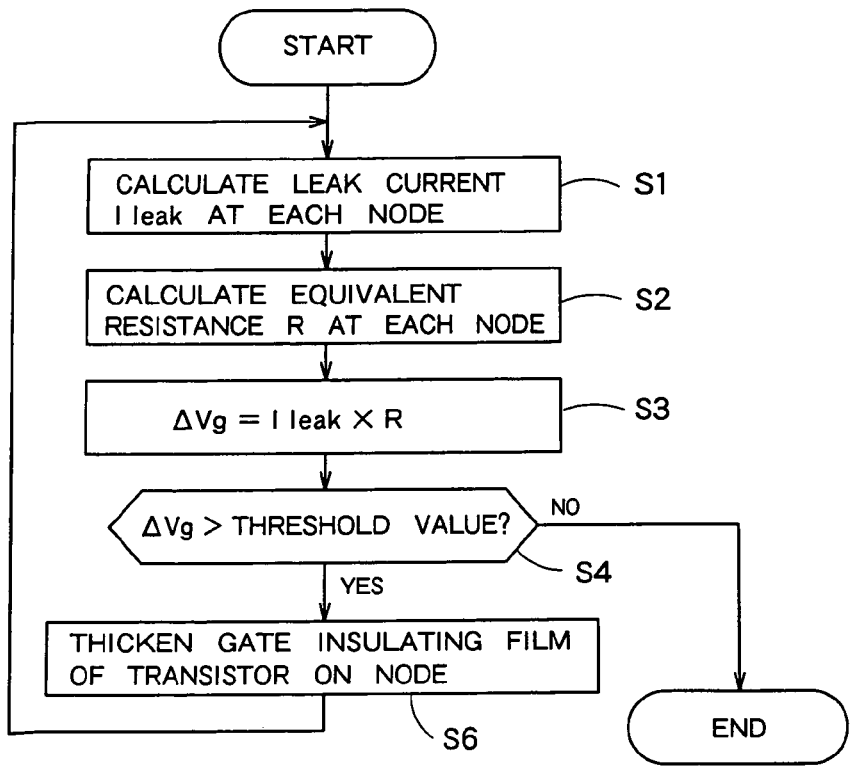
F I G. 7
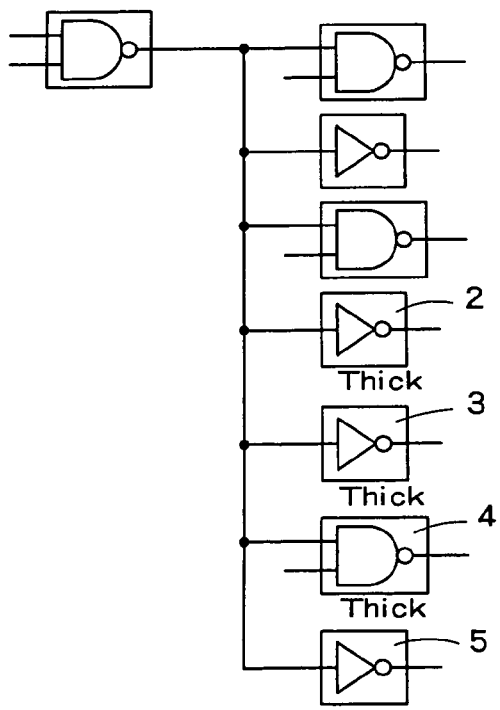
F I G. 8

METHOD OF DESIGNING SEMICONDUCTOR INTEGRATED CIRCUIT AND APPARATUS FOR DESIGNING THE SAME

CROSS REFERENCE TO RELATED APPLICATIONS

This application is based upon and claims the benefit of priority from the prior Japanese Patent Application No. 2005-103296, filed on Mar. 31, 2005, the entire contents of which are incorporated herein by reference.

BACKGROUND OF THE INVENTION

1. Field of the Invention

The present invention relates to a method of designing a semiconductor integrated circuit and an apparatus for designing the same.

2. Related Art

With improvement of integration due to advancement of miniaturization technology of transistors, a gate insulating film is becoming thinner and thinner. As the gate insulating film becomes thinner, there may arise a problem that a current flowing from a gate to a substrate, a source or a drain increases. If such a problem occurs, voltages at nodes in the circuit differ from desirable voltages, which cause a malfunction of the circuit or an increase of a leak current.

SUMMARY OF THE INVENTION

According to one embodiment of the present invention, a method of designing a semiconductor integrated circuit having a plurality of transistors, comprising:

calculating a leak current corresponding to a sum of a gate leak and a channel leak at each node in the semiconductor integrated circuit;

estimating a voltage drop value due to the calculated leak current;

determining whether or not the voltage drop value exceeds a threshold value for each node; and inserting a buffer to a node determined that the voltage drop value exceeds the threshold value.

Furthermore, according to one embodiment of the present invention, a method of designing a semiconductor integrated circuit, comprising:

calculating a leak current corresponding to a sum of a gate leak and a channel leak at each node in the semiconductor integrated circuit;

estimating a voltage drop value due to the calculated leak current;

determining whether or not the voltage drop value exceeds a threshold value at each node; and forming a gate insulating film of at least one of the transistors connected to the node determined that the voltage drop value exceeds the threshold value more thickly than the other transistors.

Furthermore, according to one embodiment of the present invention, an apparatus for designing a semiconductor integrated circuit, comprising:

a leak current calculating unit which calculates a leak current corresponding to a sum of a gate leak and a channel leak at each node in the semiconductor integrated circuit;

a voltage drop estimating unit which estimates a voltage drop value due to the calculated leak current;

a voltage drop determining unit which determines whether or not the voltage drop value exceeds a threshold value at each node; and a design changing unit which inserts a buffer to a node determined that the voltage drop value exceeds the threshold value, or forms a gate insulating film of at least one of the transistors connected to the node determined that the voltage drop value exceeds the threshold value more thickly than the other transistors.

BRIEF DESCRIPTION OF THE DRAWINGS

FIG. 1 is a flowchart showing a procedure of a method of designing a semiconductor integrated circuit according to a first embodiment of the present invention.

FIG. 2 is a circuit diagram showing an example of the semiconductor integrated circuit.

FIG. 3 is a diagram for illustrating the leak current in the case where the output of a node N1 is "0" in the circuit of FIG. 2.

FIG. 4 is a diagram for illustrating a leak current in the case where the output of the node N1 is in logic "1".

FIG. 7 is a flowchart showing a procedure of a method of designing a semiconductor device according to the second embodiment of the present invention.

FIG. 8 is a diagram showing an example of the circuit after the procedure shown in FIG. 7.

DETAILED DESCRIPTION OF THE INVENTION

Figure 5:
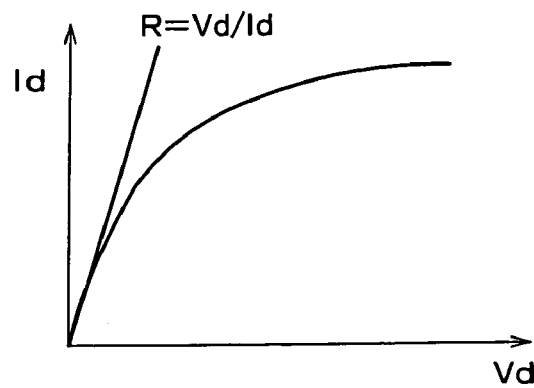
FIG. 5 is a diagram showing an example of the Vd-Id characteristics of a MOS transistor.

Hereafter, a receiver and a receiving method according to the present invention will be described more specifically with reference to the drawings.

First Embodiment

FIG. 1 is a flowchart showing a procedure of a method of designing a semiconductor integrated circuit according to a first embodiment of the present invention. The flowchart of FIG. 1 illustrates the procedure for inserting buffers to a plurality of nodes in a semiconductor integrated circuit composed of combination of MOS transistors, if necessary.

FIG. 2 is a circuit diagram showing an example of the semiconductor integrated circuit. In the following, taking the semiconductor integrated circuit shown in FIG. 2 as an example, the procedure shown in the flowchart of FIG. 1 will be described.

First, the leak current at each node in the semiconductor integrated circuit is calculated (step S1). The leak current can be sorted into the following three components:

(1) an output-side gate leak; (2) an input-side gate leak; and (3) a channel leak.

The gate leaks and the channel leak differ between the case where the node is in logic "0" and the case where the node is in logic "1". Therefore, in the following description, the leak current in the case where the node is in logic "0" and the leak current in the case where the node is in logic "1" are calculated separately, and the calculated leak currents are summed to obtain a total leak current.

FIG. 3 is a diagram for illustrating the leak current in the case where the output of a node N1 is "0" in the circuit of FIG. 2. In FIG. 3, thin solid-line arrows indicate leak currents flowing between the gate and the drain of the transistors connected to the node N1, dashed-line arrows indicate channel leak currents, and thick solid-line arrows indicate ON currents. In this case, the output-side gate leak, mentioned above as (1), is represented by $\Sigma Ig\_off\_p+\Sigma Ig\_on\_n\_dg$. The current Ig_off_p is a leak current flowing between the gate and the drain of PMOS transistors Q1 and Q2 in the OFF state. The current Ig_on_n_dg is a leak current flowing between the gate and the drain of NMOS transistors Q3 and Q4 in the ON state.

In the case where the output of the node N1 is in logic "0", the input-side gate leak, mentioned above as (2), is represented by $\Sigma Ig\_off\_n+\Sigma Ig\_on\_p$. The current Ig_off_n is a leak current flowing between the gate and the drain of NMOS transistors Q5 and Q6 in the OFF state. The current Ig_on_p is a leak current flowing from the gate to the drain, bulk or source in PMOS transistors Q7 and Q8 in the ON state.

In the case where the output at the node N1 is in logic "0", the channel leak, mentioned above as (3), is represented by $\Sigma Ich\_p$. The current Ich_p is a leak current flowing through the channel of the PMOS transistors Q1 and Q2 connected to the node N1 in the OFF state.

FIG. 4 is a diagram for illustrating a leak current in the case where the output of the node N1 is in logic "1". In this case, the output-side gate leak, mentioned above as (1), is represented by $\Sigma Ig\_off\_n+\Sigma Ig\_on\_p\_dg$. The current Ig_off_n is a leak current flowing between the gate and the drain of the NMOS transistors Q3 and Q4 in the OFF state. The current Ig_on_p_dg is a leak current flowing between the gate and the drain of PMOS transistors Q1 and Q2 in the ON state.

In the case where the output of the node N1 is in logic "1", the input-side gate leak, mentioned above as (2), is represented by $\Sigma Ig\_off\_p+\Sigma Ig\_on\_n$. The current Ig_off_p is a leak current flowing between the gate and the drain of the PMOS transistors Q7 and Q8 in the OFF state. The current Ig_on_n is a leak current flowing from the gate to the drain, bulk or source in the NMOS transistors Q5 and Q6 in the ON state.

In the case where the output of the node N1 is in logic "1", the channel leak, mentioned above as (3), is represented by $\Sigma Ich\_n$. The current Ich_n is a leak current flowing through the channel of the NMOS transistors Q3 and Q4 connected to the node N1 in the OFF state.

In step S1 described above, the leak currents (1) to (3) in the case where the output of the node N1 is in logic "0" and the leak currents (1) to (3) in the case where the output of the node N1 is in logic "1" are summed to determine the total leak current.

Then, An equivalent resistance R at each node is calculated (step S2). The equivalent resistance R is calculated based on the voltage/current characteristics of the gate voltage Vd and the drain current Id of a MOS transistor. FIG. 5 shows an example of the Vd-Id characteristics of a MOS transistor. As can be seen from FIG. 5, within a range of low values of the drain voltage Vd, the drain voltage Vd and the drain current Id are linearly proportional to each other. Thus, using the range, the equivalent resistance R (=Vd/Id) is calculated.

Then, for each node, the voltage drop value $\Delta Vg$ (=Ileak× R) due to the leak current Ileak (=Ileak×R) is calculated (step S3).

Then, it is determined whether the voltage drop value $\Delta Vg$ at each node exceeds a predetermined threshold or not (step S4). If it is determined that the voltage drop value at a node exceeds the predetermined threshold, a buffer is inserted to the node (step S5). Here, considering the layout of the entire semiconductor integrated circuit, the buffer is inserted to a vacant area that can easily dispose the buffer. Then, returning to step S1, the leak current of the circuit with the inserted buffer is again calculated.

If it is determined that the voltage drop values $\Delta Vg$ at all the nodes exceed the predetermined threshold in step S4, the process is ended.

Figure 6A:
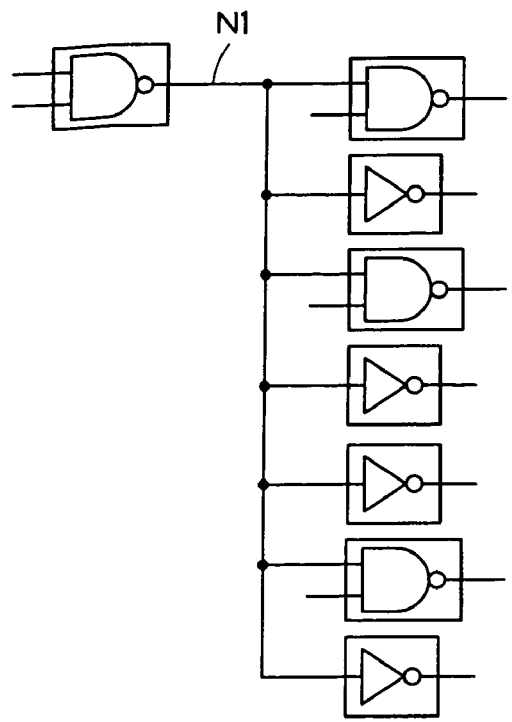
FIG. 6A is a diagram showing the circuit before the buffer 1 is inserted.
Figure 6B:
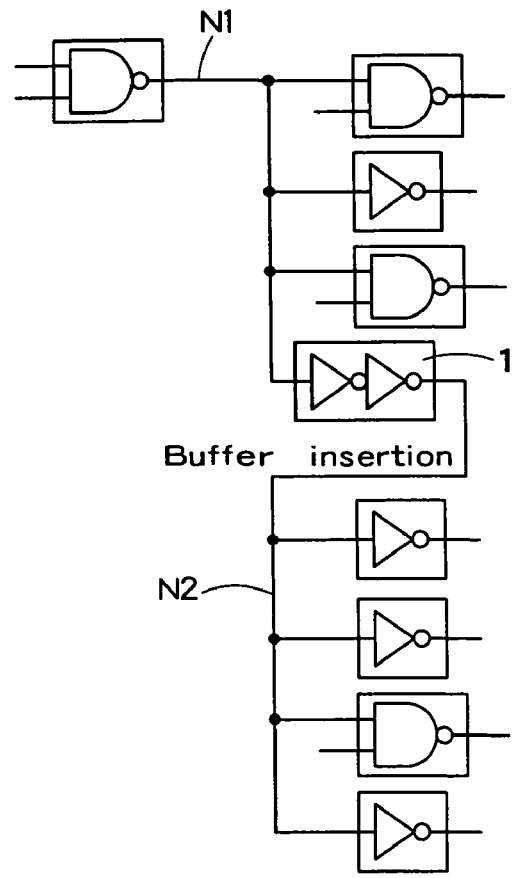
FIG. 6B is a diagram showing the circuit after a buffer 1 is inserted.

FIGS. 6A and 6B show the circuits before and after performing the procedure shown in FIG. 1. FIG. 6A shows the circuit before the buffer 1 is inserted, and FIG. 6B shows the circuit after a buffer 1 is inserted. Multiple gates are connected to the node N1 shown in FIG. 6A, so that the leak current increases, and the voltage drop of the node N1 also increases. The leak current can be reduced by inserting the buffer 1.

As described above, according to the first embodiment, the leak current, which is a sum of the gate leaks and the channel leaks, is calculated for each node in the semiconductor integrated circuit, and a buffer is inserted to any node determined that the voltage drop value $\Delta Vg$ due to the calculated leak current exceeds a threshold. Thus, a problem that a gate leak or channel leak causes an unstable node voltage can be prevented, and reliability of the circuit can be improved.

Second Embodiment

According to a second embodiment, a voltage drop due to a leak current at each node is reduced without insertion of a buffer.

In general, a transistor having a thin gate insulating film has a large gate leak, but can operate fast because the ON current is large. To the contrary, a transistor having a thick gate insulating film has a small gate leak, but cannot operate fast because the ON current is also small. In this way, the thickness of the gate insulating film and the magnitude of the gate leak are in a tradeoff relationship.

Therefore, in this embodiment, according to the procedure shown in FIG. 1 described above, the leak current at each node is calculated, and it is determined whether the voltage drop value due to the gate current at each node exceeds a threshold or not. The above-mentioned process is the same as that according to the first embodiment.

According to the second embodiment, unlike the first embodiment, the gate insulating film of at least one of the transistors connected to a node at which the voltage drop value due to the gate current exceeds the threshold is thickened compared with those of the other transistors. However, as for transistors in which timing is critical, the gate insulating film is not thickened.

FIG. 7 is a flowchart showing a procedure of a method of designing a semiconductor device according to the second embodiment of the present invention. In FIG. 7, the same steps as those in FIG. 1 are denoted by the same step numbers.

In step S4, as for a node determined that the voltage drop value $\Delta Vg$ exceeds the predetermined threshold, among the transistors connected to the node, the gate insulating film of at least one transistor except for the transistor that timing is critical is thickened (step S6).

FIG. 8 shows an example of the circuit after the procedure shown in FIG. 7. As shown in this drawing, among the gates constituted by the transistors connected to a node at which the voltage drop value $\Delta Vg$ exceeds the threshold, the gate insulating films of the transistors in gates 2 to 5 in which timing is not critical are thickened.

As described above, according to the second embodiment, the gate insulating films of the transistors connected to a node at which the voltage drop value due to the leak current is large is thickened. Therefore, the voltage drop at each node can be reduced without insertion of a buffer, and area for forming the circuit can be reduced compared with the first embodiment. In addition, since no buffer is used, a time lag of the circuit can also be reduced.

Third Embodiment

The above-mentioned processing operations in FIGS. 1 and 7 may be carried out by a computer in a form of a computer program. Otherwise, a semiconductor integrated circuit designing apparatus for carrying out at least a portion of the processing operations in FIGS. 1 and 7 may be provided in a form of hardware.

Figure 9:
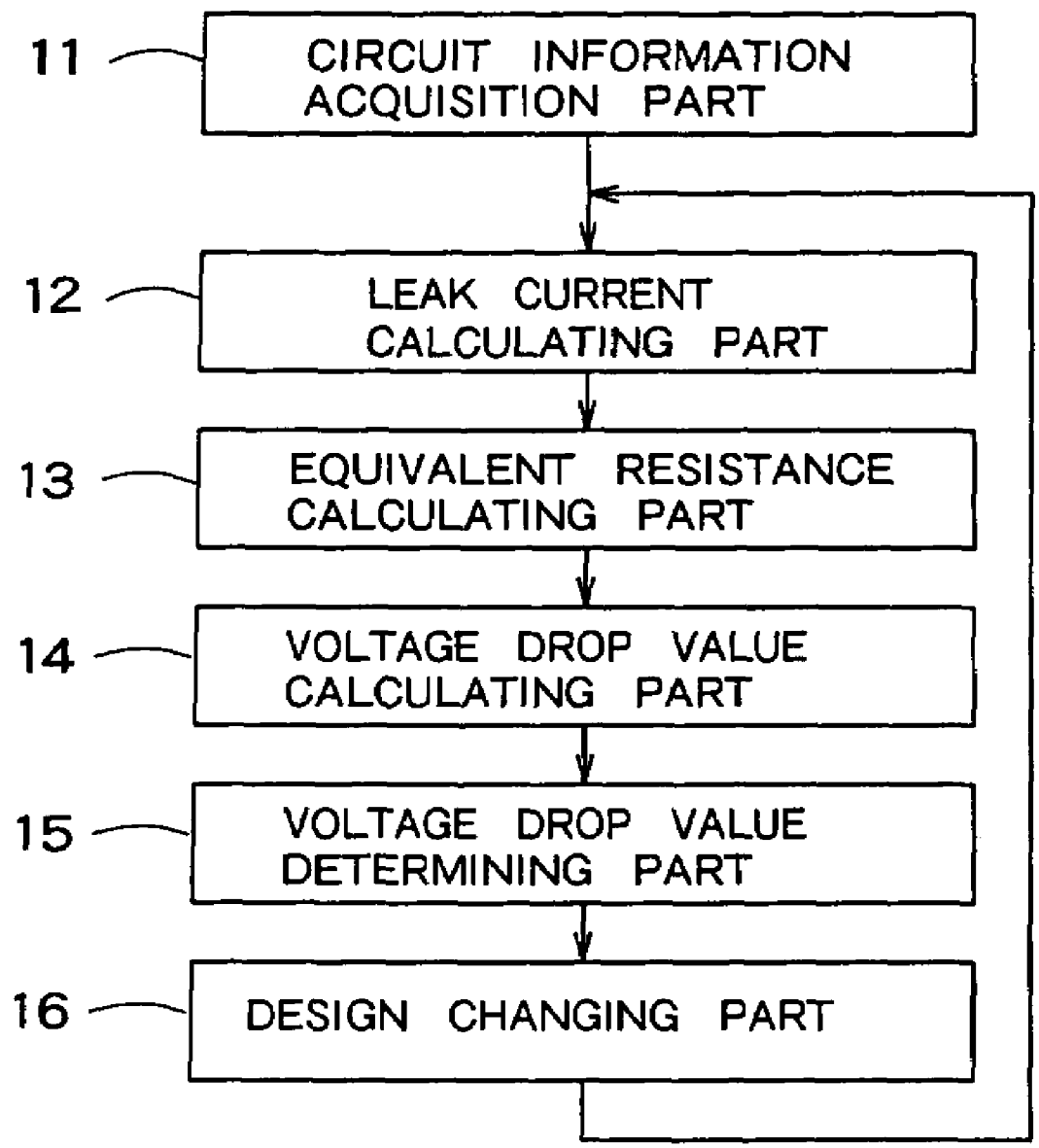
FIG. 9 is a block diagram showing an example of the semiconductor integrated circuit designing apparatus capable of carrying out the processing operations of FIGS. 1 and 7.

FIG. 9 is a block diagram showing an example of the semiconductor integrated circuit designing apparatus capable of carrying out the processing operations of FIGS. 1 and 7. The semiconductor integrated circuit designing apparatus in FIG. 9 has a circuit information acquisition part 11, a leak current calculating part 12, an equivalent resistance calculating part 13, a voltage drop calculating part 14, a voltage drop determination part 15 and a design changing part 16.

The circuit information acquisition part 11 acquires connection information of each circuit element in the semiconductor integrated circuit. The circuit information acquisition part 11 may carry out basic design of the semiconductor integrated circuit, or may receive the design information carried out by the other apparatus.

The leak current calculating part 12 carries out the same processing operation as step S1 in FIG. 1 or FIG. 7. The equivalent resistance calculating part 13 carries out the same processing operation as step S2 in FIG. 1 or FIG. 7. The voltage drop calculating part 14 carries out the same processing operation as step S3 in FIG. 1 or FIG. 7. The voltage drop determination part 15 carries out the same processing operation as step S4 in FIG. 1 or FIG. 7.

The design changing part 16 carries out the same processing operation as step S5 in FIG. 1 or step S6 in FIG. 7. More specifically, a buffer is inserted to a node at which the voltage drop value exceeds the threshold voltage, or a gate insulating film of at least one transistor connected to the node is thickened.

After the processing of the design changing part 16 has finished, the leak current calculating part 12 and the subsequent parts again carry out the processings. These parts continuously carry out the processings until when the voltage drop determination part 15 determines that the voltage drop values at all the nodes do not exceed the threshold voltage.

The semiconductor integrated circuit designing apparatus in FIG. 9 may be composed of a plurality of hardware apparatuses, or at least a portion of the apparatus in FIG. 9 may be composed of software.

What is claimed is:

1. A method of designing a semiconductor integrated circuit having a plurality of transistors, comprising:
   calculating a leak current corresponding to a sum of a gate leak and a channel leak at each node in the semiconductor integrated circuit;
   estimating a voltage drop value due to the calculated leak current;
   determining whether or not the voltage drop value exceeds a threshold value for each node; and
   inserting a buffer to a node determined that the voltage drop value exceeds the threshold value.

2. A method of designing a semiconductor integrated circuit according to claim 1, further comprising:
   calculating an equivalent resistance of the transistor by using a linear region on a property relating to a drain voltage and a drain current of the transistor,
   wherein the voltage drop value is calculated by multiplying the calculated equivalent resistance by the leak current.

3. A method of designing a semiconductor integrated circuit according to claim 1,
   wherein the buffer is inserted in a vacant area on the node determined that the voltage drop value exceeds the threshold value.

4. A method of designing a semiconductor integrated circuit according to claim 1, further comprising:
   recalculating the leak current at each of a node at input side of the buffer and a node at output side of the buffer, after inserting the buffer to the node determined that the voltage drop value exceeds the threshold value;
   determining whether the voltage drop value due to the recalculated leak current exceeds the threshold value; and
   repeating insertion of the buffer and recalculation of the leak current until the node exceeding the threshold value disappears.

5. A method of designing a semiconductor integrated circuit according to claim 1,
   wherein the gate leak is a sum of a gate leak of a transistor at output side at each node and a gate leak of a transistor at input side.

6. A method of designing a semiconductor integrated circuit according to claim 5,
   wherein the gate leak of the transistor at output side is a sum of a leak current flowing between a drain and a gate of a first conductive type transistor in OFF state at output side and a leak current flowing between a drain and a gate of a second conductive type transistor in ON state at output side; and
   the gate leak of the transistor at input side is a sum of a leak current flowing between a drain and a gate of a second conductive type transistor in OFF state at input side and a leak current flowing between a drain and a gate of a first conductive type transistor in ON state at input side.

* * * * *